United States Patent [19]
Seok

[11] Patent Number: 5,753,942
[45] Date of Patent: May 19, 1998

[54] POWER SEMICONDUCTOR DEVICES HAVING ARCUATE-SHAPED SOURCE REGIONS FOR INHIBITING PARASITIC THYRISTOR LATCH-UP

[75] Inventor: Kyung-Wook Seok, Seoul, Rep. of Korea

[73] Assignee: Samsung Electronics Co., Ltd., Suwon, Rep. of Korea

[21] Appl. No.: 777,043

[22] Filed: Dec. 30, 1996

[30] Foreign Application Priority Data

Dec. 30, 1995 [KR] Rep. of Korea ............ 95-68224

[51] Int. Cl.[6] ................................................ H01L 29/74
[52] U.S. Cl. .................... 257/133; 257/341; 257/345; 257/401
[58] Field of Search ................................ 257/133, 341, 257/401, 653, 345

[56] References Cited

U.S. PATENT DOCUMENTS

| | | |
|---|---|---|
| 3,753,055 | 8/1973 | Yamashita et al. ............ 317/235 R |
| 4,831,424 | 5/1989 | Yoshida et al. ............ 357/23.13 |
| 4,980,740 | 12/1990 | Pattanayak et al. ............ 357/38 |
| 5,089,864 | 2/1992 | Sakurai ............ 357/23.4 |
| 5,095,343 | 3/1992 | Klodzinski et al. ............ 357/23.4 |
| 5,136,349 | 8/1992 | Yilmaz et al. ............ 357/23.4 |
| 5,198,687 | 3/1993 | Baliga ............ 257/137 |
| 5,258,638 | 11/1993 | Elhatem et al. ............ 257/401 |
| 5,315,139 | 5/1994 | Endo ............ 257/380 |
| 5,323,036 | 6/1994 | Neilson et al. ............ 257/287 |
| 5,338,961 | 8/1994 | Lidow et al. ............ 257/342 |
| 5,468,668 | 11/1995 | Neilson et al. ............ 437/51 |
| 5,475,243 | 12/1995 | Saito ............ 257/171 |
| 5,490,095 | 2/1996 | Shimada et al. ............ 364/578 |
| 5,519,241 | 5/1996 | Opperman et al. ............ 257/327 |
| 5,548,133 | 8/1996 | Kinzer ............ 257/155 |
| 5,563,439 | 10/1996 | Chung et al. ............ 257/365 |

OTHER PUBLICATIONS

Nandakumar et al., The Base Resistance Controlled Thyristo (BRT) "A New MOS Gated Power Thyristor", IEEE, 1991, pp. 138–141, Dec. 1991.

Primary Examiner—Mark V. Prenty
Attorney, Agent, or Firm—Myers, Bigel, Sibley & Sajovec

[57] ABSTRACT

Power semiconductor devices have a plurality of arcuate-shaped source regions arranged in a row along a serpentine-shaped insulated gate electrode and at least one bypass region for collectively inhibiting parasitic thyristor latch-up. These power semiconductor devices include a semiconductor substrate containing a drift region of first conductivity type therein extending to a first face thereof and a base region of second conductivity type in the drift region. The base region is preferably formed to have a perimeter which defines a large area P-N junction with the drift region. A plurality of arcuate-shaped source regions of first conductivity type are also provided in the base region. The source regions are defined by respective perimeters containing concave-shaped segments which are spaced from the perimeter of the base region. A serpentine-shaped insulated gate electrode is also provided so that inversion-layer channels of first conductivity type can be formed in the base region to electrically connect the source regions to the drift region, upon the application of a first potential bias (e.g., positive) thereto. The plurality of arcuate-shaped source regions may be arranged as a row of arcuate-shaped source regions spaced end-to-end in the base region along the length of the serpentine-shaped insulated gate electrode.

22 Claims, 15 Drawing Sheets ance 5,753,942

POWER SEMICONDUCTOR DEVICES HAVING ARCUATE-SHAPED SOURCE REGIONS FOR INHIBITING PARASITIC THYRISTOR LATCH-UP

FIELD OF THE INVENTION

The present invention relates to semiconductor devices, and more particularly to power semiconductor devices for high current applications.

BACKGROUND OF THE INVENTION

Typical power semiconductor devices such as DMOS-FETs (double diffused metal oxide silicon filed effect transistors) and IGBTs (insulated-gate bipolar transistors) are well-known to those skilled in the art. For example, FIG. 1 is a cross-sectional view of a conventional N-channel IGBT. As illustrated, an $N^+$ type buffer layer 2 is formed on a $P^+$ type semiconductor substrate 1, an $N^-$ type epi layer 3 (i.e., drift region) is formed on the $N^+$ type buffer layer 2. A P type base region 4 is formed in the $N^-$ type epi layer 3, and an $N^+$ source region 7 is formed in the P type base region 4. The P type base region 4 is divided into a $P^+$ contact region 5 of high density and a P type channel region 6 of lower density than that of the $P^+$ contact region 5. The P type channel region 6 extends under the $N^+$ source region 7 and up into the space between the source region 7 and the epi layer 3 at the top face. A gate 10 is formed on the top face of the substrate, opposite the epi layer 3, the P type channel region 6 and the $N^+$ source region 7. The gate 10 includes a gate electrode 11 and a gate insulating layer 12 surrounding the gate electrode 11. In addition, the $P^+$ contact region 5 and the $N^+$ source region 7 contact a cathode electrode 13, and an anode electrode 14 is formed on an opposite face of the substrate. As will be understood by those skilled in the art, conventional DMOSFETs are similar to the above described IGBT, however, the $P^+$ substrate 1 is replaced with an $N^+$ substrate.

Referring now to FIGS. 2A and 2B, plan views of conventional power semiconductor devices are illustrated. Here, FIG. 1 is an equivalent cross-sectional view of the devices of FIGS. 2A and 2B, taken along line I—I. As will be understood by those skilled in the art, the application of a forward bias to the anode electrode 14 and the application of a positive bias to the gate electrode 11 will cause the IGBT to turn-on in a forward conduction mode of operation. In particular, the application of a sufficiently positive bias to the gate electrode 11 will cause the formation of an N-type inversion-layer channel in the P-type channel region 6, underneath the gate electrode 11. This N-type inversion layer channel electrically connects the source region 7 to the drift region 3 and allows electrons $I_e$ to be transferred from the source region 7 to the drift region 3 under the influence of the forward bias applied to the anode electrode 14. When this occurs, hole current $I_h$ will be emitted by the emitter/substrate region 1 and some of this hole current will be collected by the P-type base region 4 and flow laterally underneath the N-type source region 7 to the cathode contact 13. Unfortunately, at high forward current densities, the lateral resistance of the P-type base region 4 underneath the source region 7 will cause the P-N junction formed between the base region 4 and source region 7 to become forward biased. When this occurs, the vertical parasitic P-N-P-N thyristor formed by regions 1–7 may enter a latch-up mode of operation which cannot be stopped by the mere removal of the potential applied to the gate electrode 11. Such parasitic thyristor latch-up can cause irreparable damage to the device.

Attempts have been made to address this parasitic thyristor latch-up phenomenon. One such attempt included steps to reduce the lateral resistance of the P-type base region underneath the source region so that the likelihood that the base/source junction would become forward biased during forward conduction would be reduced. Another attempt is commonly referred to as the atomic layer lattice (ALL) structure, as illustrated by FIG. 3. Referring now to FIG. 3, the shaded portion indicates the gate electrode and arrows represent the flow of current during forward conduction. The shape of the gate electrode 11 is circular. The gate electrode contains gate electrode bridges 20 of small width which connect the circular gate electrodes 11. As will be understood by those skilled in the art, because the shape of the gate electrodes 11 are circular and convex, the voltage drop in the base region is reduced during high forward current conduction and therefore the likelihood of parasitic thyristor latch-up is reduced. However, the device of FIG. 3 is susceptible to another parasitic such as avalanche breakdown which can occur in an active area of the device such as the channel region. However, if voltage breakdown is made to occur in a region away from the active area and the breakdown voltage level in this region is lower than the breakdown voltage in the active area, the above-mentioned problems can be suppressed. An example of a proposed structure for improving the avalanche breakdown characteristics of power devices is disclosed in U.S. Pat. No. 5,136,349 to Yilmaz et al. entitled Closed Cell Transistor With Built-in Voltage Clamp.

The structure disclosed in the '349 patent is more fully described below with respect to FIGS. 4A–4B. In particular, FIG. 4A is a layout of the power transistor of U.S. Pat. No. 5,136,349 and FIG. 4B is a perspective and sectional view taken along the line IVB—IVB in FIG. 4A.

This structure is based on the structure in FIG. 3, however the gate electrodes 11 are square instead of being circular. A significant difference between this structure and the structure in FIG. 3 is that a cylindrical clamping or bypass region 30 of $P^+$ type is formed in a central part of the square gate electrodes 11. The breakdown voltage in the clamping region 30 is lower than that in the cylindrical junction. Thus, breakdown occurs in the clamping region 30 before breakdown occurs in the active area since the clamping region 30 is spherical. Accordingly, the device can be protected by causing breakdown to occur first in the clamping area 30.

On the other hand, one of the disadvantages of this power transistor is that the on-state forward voltage drop is higher by 0.2V compared to conventional power transistors. One main cause for the increase voltage drop is a result of the area occupied by the bridges 20 for connecting the gate electrodes to one another. The structure in FIG. 3 as well as the structures of FIGS. 2A and 2B have this disadvantage. The channel may be formed in a lower part in the structure since the bridges 20 have the same sectional structure to the gate electrodes 11. However, this channel does not help the flow of current due to the parasitic junction field effect transistor (JFET) effect. In addition, latch-up may easily occur since connection portions of the bridges 20 and the gate electrodes 11 are concave. As will be understood by those skilled in the art, the area occupied by the bridges 20 and the insulating layer surrounding the bridges 11 is wasteful since these bridges 20 only transmit the gate voltage and do not contribute to enhancement of performance of the device according to the width or the length of the channel. Accordingly, it is preferable to reduce the area of the bridges 20 and to widen the width and the length of the channel. On the other hand, the speed of the device may become slow since the resistance of the bridges 20 may become large when the area of the bridges 20 is reduced.

Notwithstanding the above described attempts to develop power semiconductor devices having reduced susceptibility to parasitic thyristor latch-up and low on-state forward voltage drop, there continues to be a need for improved devices which are less susceptible to these parasitics.

SUMMARY OF THE INVENTION

It is therefore an object of the present invention to provide improved semiconductor devices for power applications.

It is another object of the present invention to provide power semiconductor devices having high current carrying capability.

It is still another object of the present invention to provide power semiconductor devices having low on-state forward voltage drop.

It is a further object of the present invention to provide insulated-gate bipolar transistors having reduced susceptibility to parasitic thyristor latch-up even at high forward current densities.

These and other objects, advantages and features of the present invention are provided by power semiconductor devices having a plurality of arcuate-shaped source regions arranged in a row along a serpentine-shaped insulated gate electrode and at least one bypass region for collectively inhibiting parasitic thyristor latch-up. In particular, preferred power semiconductor devices comprise a semiconductor substrate containing a drift region of first conductivity type therein extending to a first face thereof and a base region of second conductivity type in the drift region. The base region is preferably formed to have a perimeter which defines a large area P-N junction with the drift region. A plurality of arcuate-shaped source regions of first conductivity type are also provided in the base region. The source regions are defined by respective perimeters containing concave-shaped segments which are spaced from the perimeter of the base region. A serpentine-shaped insulated gate electrode is also provided so that inversion-layer channels of first conductivity type can be formed in the base region to electrically connect the source regions to the drift region, upon application of a first potential bias (e.g., positive) thereto.

According to one embodiment of the present invention, the plurality of arcuate-shaped source regions are arranged as a row of arcuate-shaped source regions spaced end-to-end in the base region along the length of the serpentine-shaped insulated gate electrode. Here, a first edge of the gate electrode preferably contains a plurality of convex-shaped segments and each of the arcuate-shaped source regions is arranged opposite a respective convex-shaped segment. The perimeter of the base region is also formed to have a plurality of concave-shaped segments which are arranged opposite respective concave-shaped segments at the perimeters of the source regions. A bypass region of second conductivity type is also provided in the drift region at the first face, adjacent the base region. A second edge of the gate electrode is preferably formed over the bypass region so that upon the application of a second potential bias (e.g., negative) an inversion-layer channel of second conductivity type will be formed in the drift region, to electrically connect the base region to the bypass region. In particular, the formation of a direct electrical connection in the substrate between the base region and bypass region lowers the effective base resistance to the point where the P-N junctions between the source regions and the base region cannot remain forward biased even at high forward current densities. Thus, by electrically connecting the bypass region to the base region, the likelihood of sustained parasitic thyristor latch-up is suppressed.

DESCRIPTION OF PREFERRED EMBODIMENTS

Figure 1:
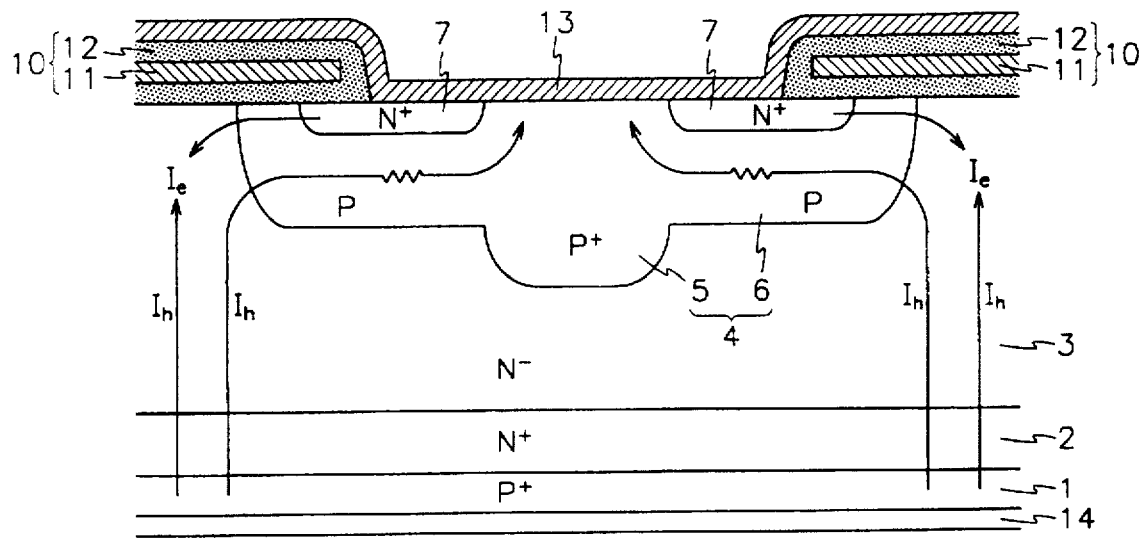
FIG. 1 is a schematic cross-sectional view of a vertical insulated-gate bipolar transistor (IGBT) according to the prior art.
Figure 2A:
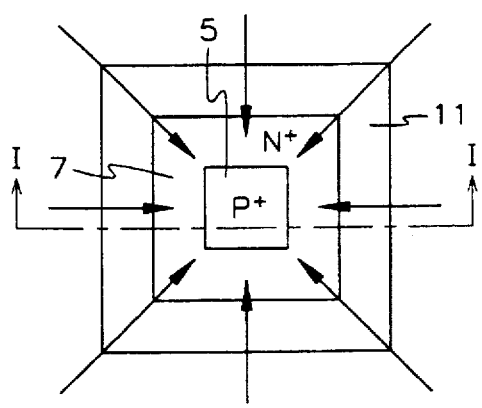
FIG. 2A is a plan view of a power semiconductor device having a square annular-shaped insulated gate electrode and central base contact region, according to the prior art.
Figure 2B:
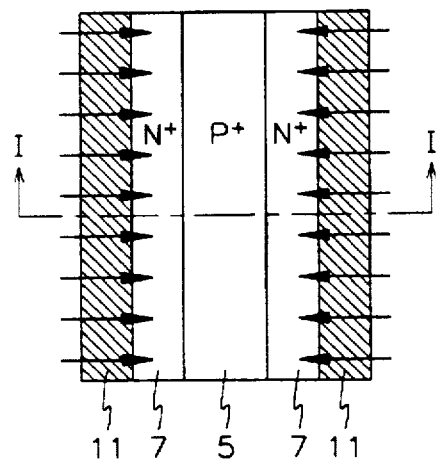
FIG. 2B is a plan view of a power semiconductor device having a pair of stripe-shaped insulated gate electrodes in parallel and a central contact region, according to the prior art.
Figure 3:
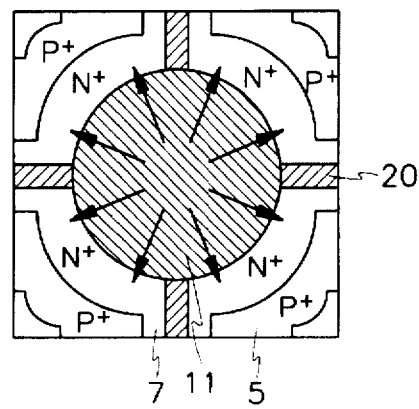
FIG. 3 is a plan view of a power semiconductor device unit cell having a lattice-shaped gate electrode, according to the prior art.
Figure 4A:
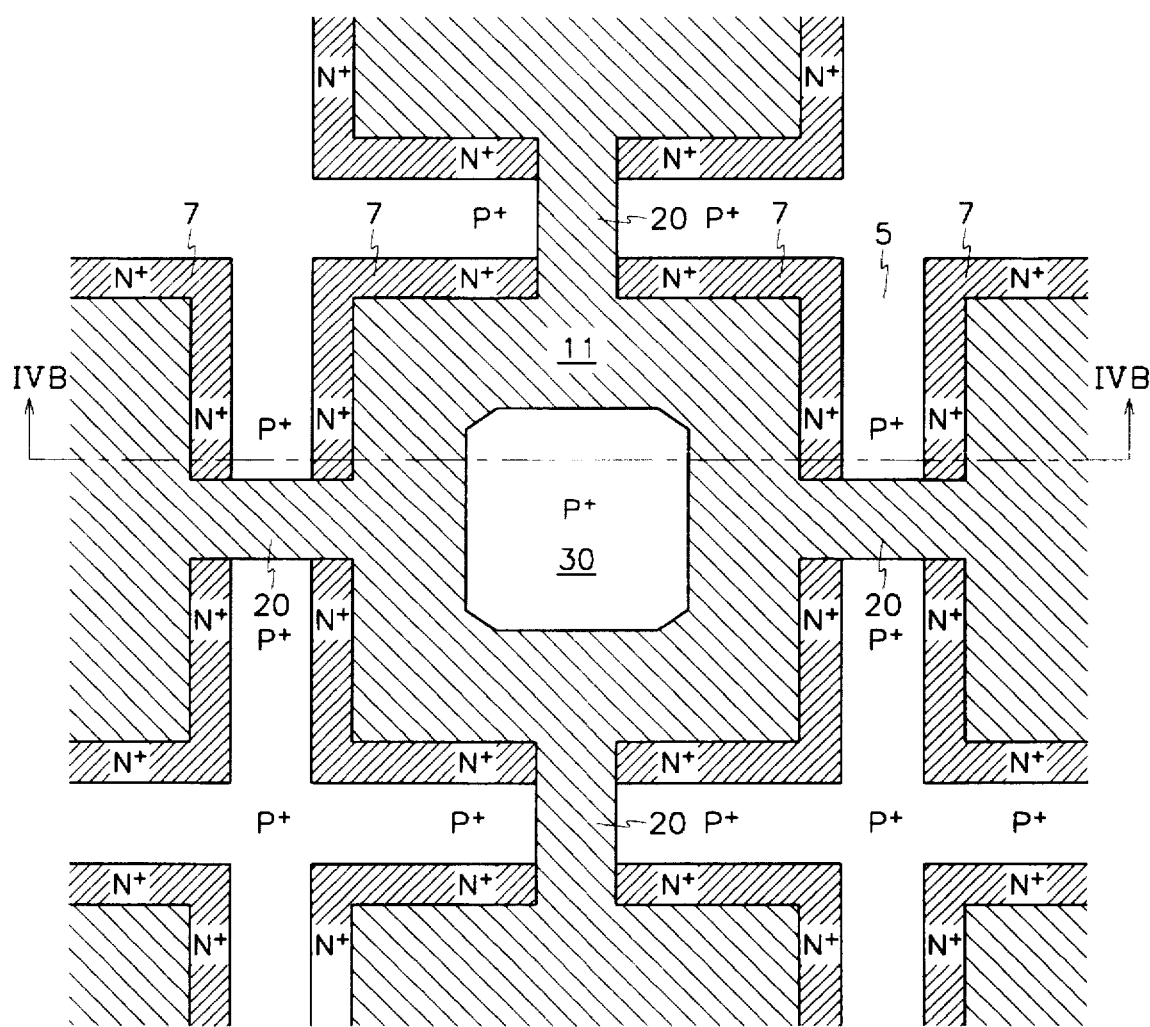
FIGS. 4A and 4B are plan and perspective views, respectively, of an insulated-gate bipolar transistor having stripe-shaped gate electrodes and a central bypass region, according to the prior art.
Figure 4B:
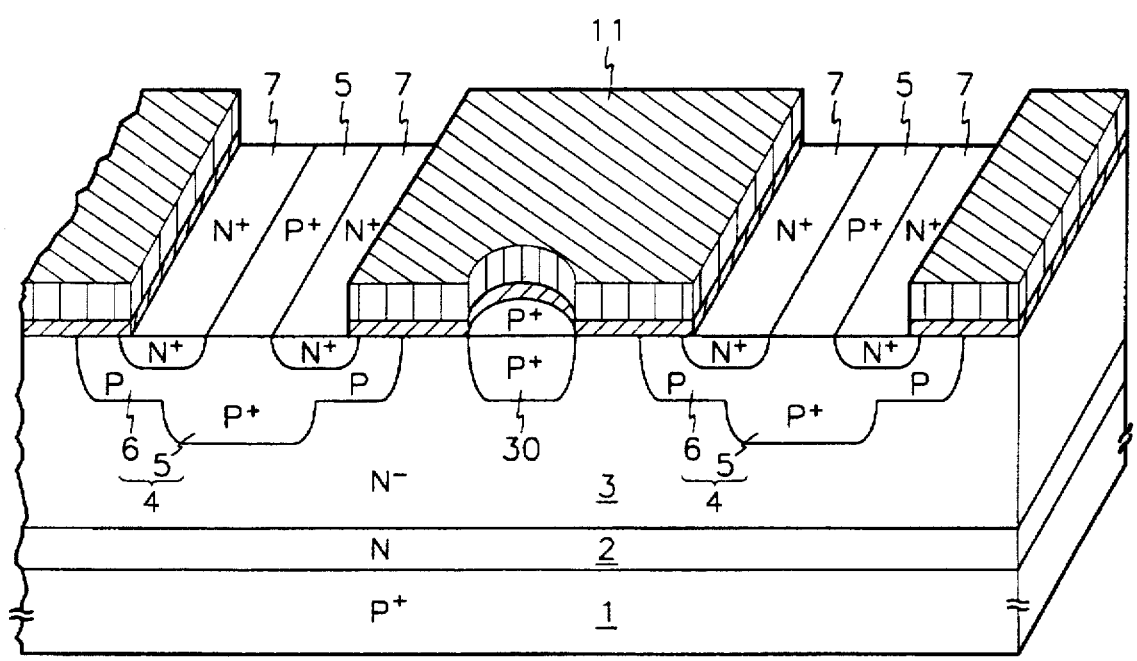

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Like numbers in FIGS. 5A-10 refer to like elements. Moreover, the terms "first conductivity type" and "second conductivity type" refer to opposite conductivity types such as P or N-type, however, each embodiment described and illustrated herein incomplementary embodiment as well.

Figure 5A:
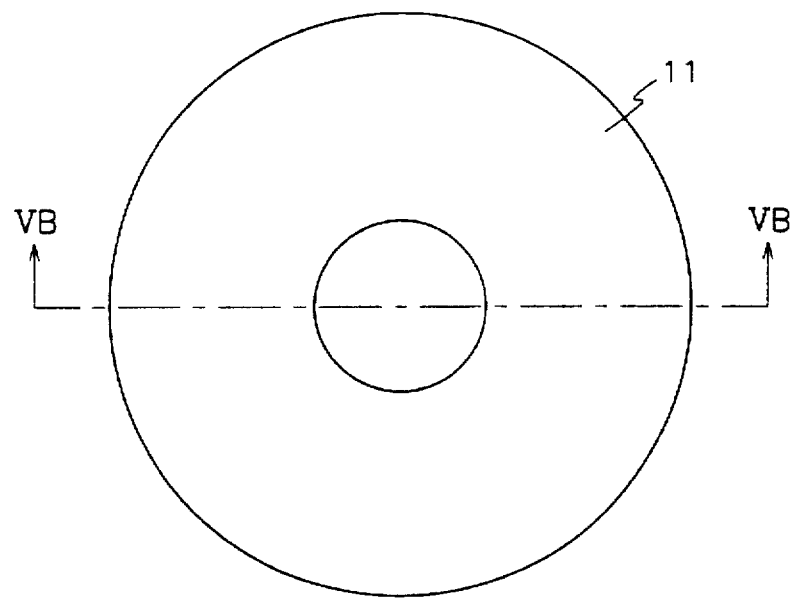
FIG. 5A is a plan view of a power semiconductor device having a circular annular-shaped gate electrode, according to a first embodiment of the present invention.
Figure 5B:
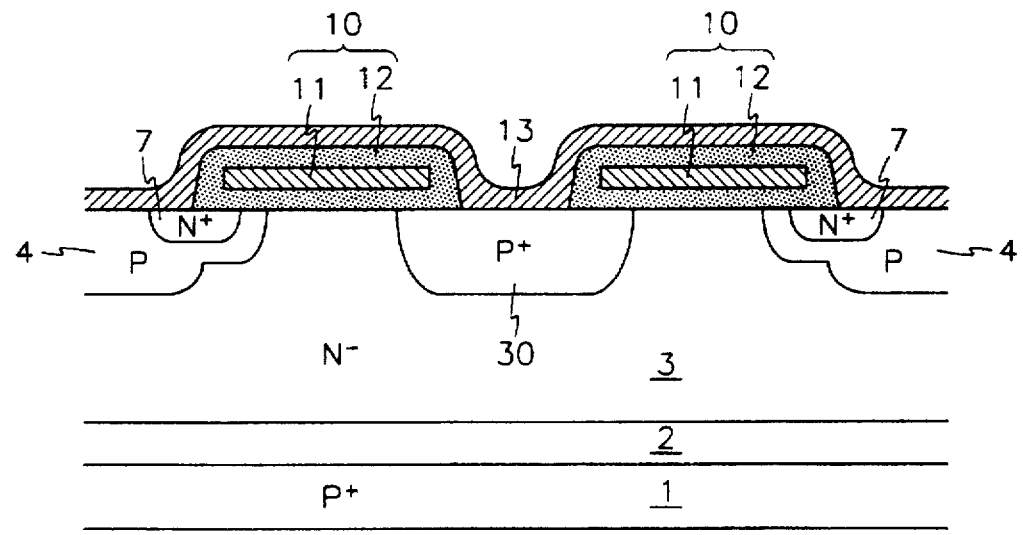
FIG. 5B is a cross-sectional view of the power semiconductor device of FIG. 5A, taken along line VB-VB.
Figure 6:
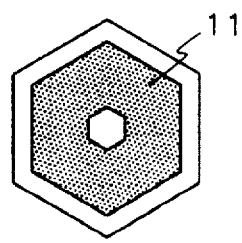
FIG. 6 is a plan view of a power semiconductor device having a hexagonal-shaped unit cell structure, according to a second embodiment of the present invention.

Referring now to FIGS. 5A–5B, a preferred insulated-gate bipolar transistor having a ring-shaped gate electrode 11 is illustrated. In particular, as illustrated by FIG. 5B which is a cross-sectional view of the structure of FIG. 5A taken along line VB—VB, a central bypass region 30 is provided between adjacent P-base regions 4 and a ring-shaped gate electrode 11 is provided so that the application of a first potential bias (e.g., positive) thereto causes the formation of a ring-shaped inversion layer channel in the portion of the base region 4 extending between the ring-shaped source region 7 and the drift region 3. As will be understood by those skilled in the art, the formation of an inversion-layer channel will cause the device of FIG. 5B to turn on if the anode region 1 is forward biased relative to the cathode 13 or P-base region 4. Here, the anode region 1 acts as an emitter of holes, the P-base region 4 and bypass region 30 act as collectors of holes and the drift region 3 acts as a floating base until the inversion-layer channel is formed to transmit electrons from the source region 7 into the drift region 3. Thus, the anode region 1, drift region 3 and the P-base region 4 (and bypass region 30) collectively form a vertical bipolar transistor. As will be understood by those skilled in the art, the hexagonal shaped ring electrode 11 of FIG. 6 may be used in place of the circular shaped ring electrode 11 of FIG. 5A.

Figure 7A:
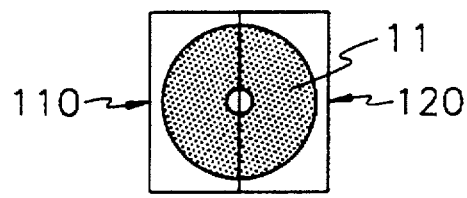
FIG. 7A is a plan view of a unit cell of a power semiconductor device having a circuit annular-shaped gate electrode, according to the first embodiment of the present invention.
Figure 7B:
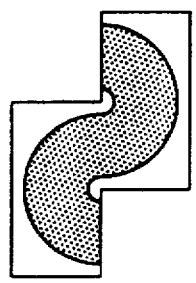
FIGS. 7B-7E are plan views of various serpentine-shaped gate electrodes according to the present invention.
Figure 7C:
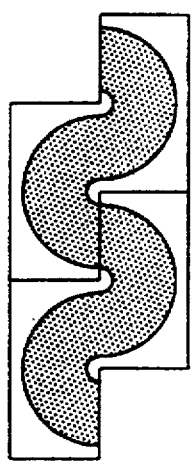
Figure 7D:
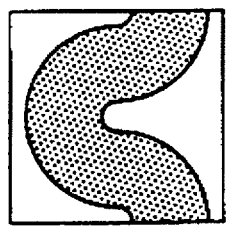
Figure 7E:
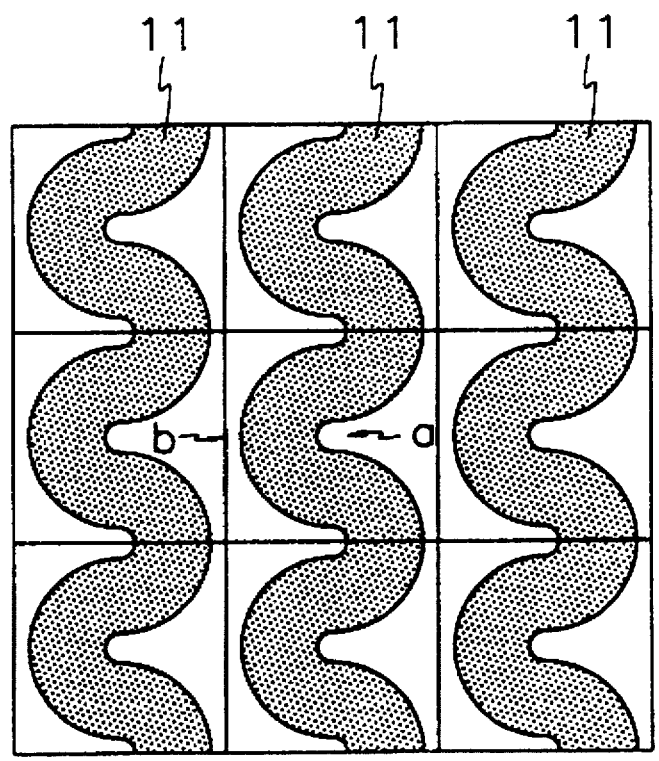
Figure 7F:
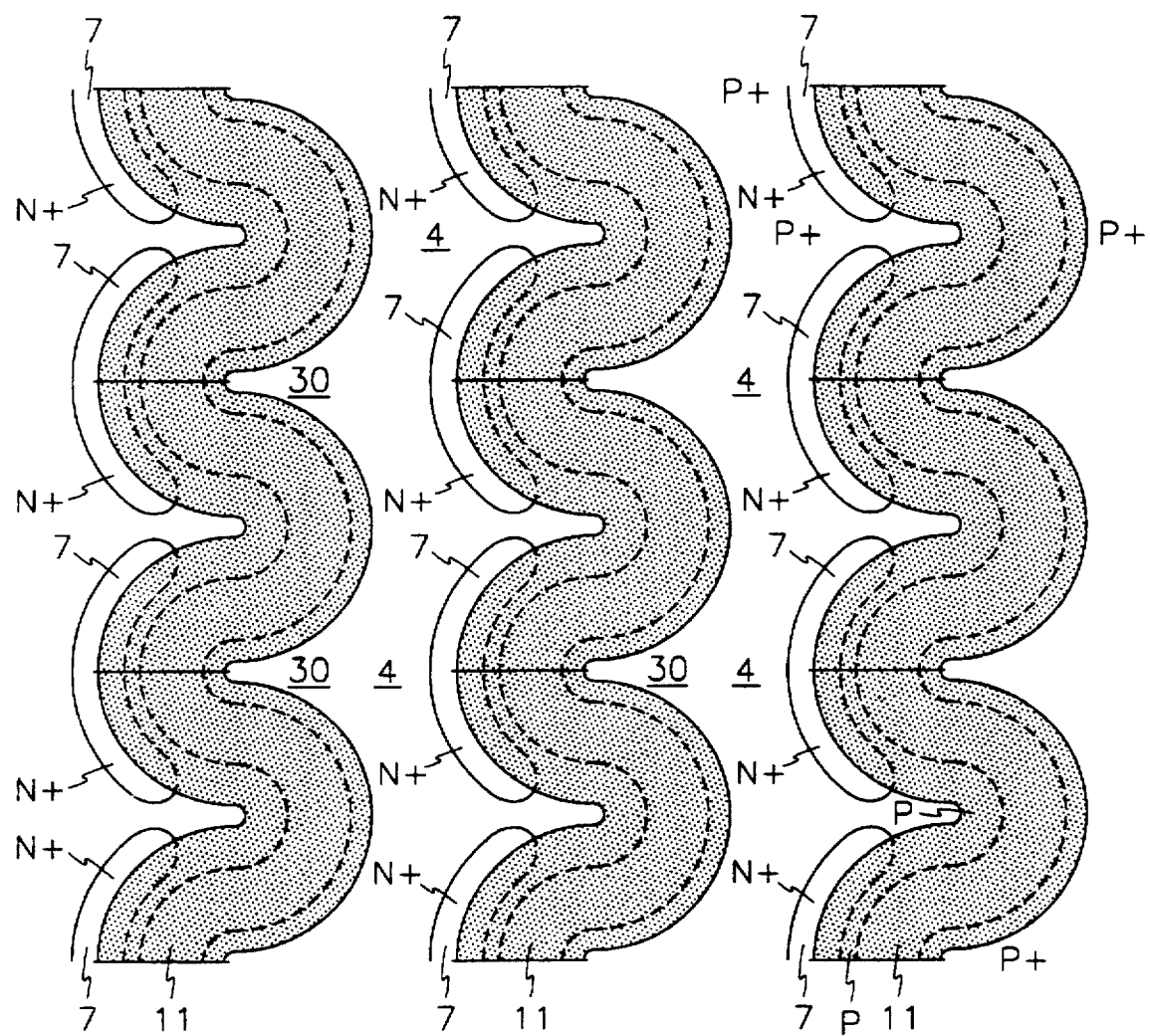
FIG. 7F is a plan view of a multi-celled power semiconductor device according to a third embodiment of the present invention.
Figure 7G:
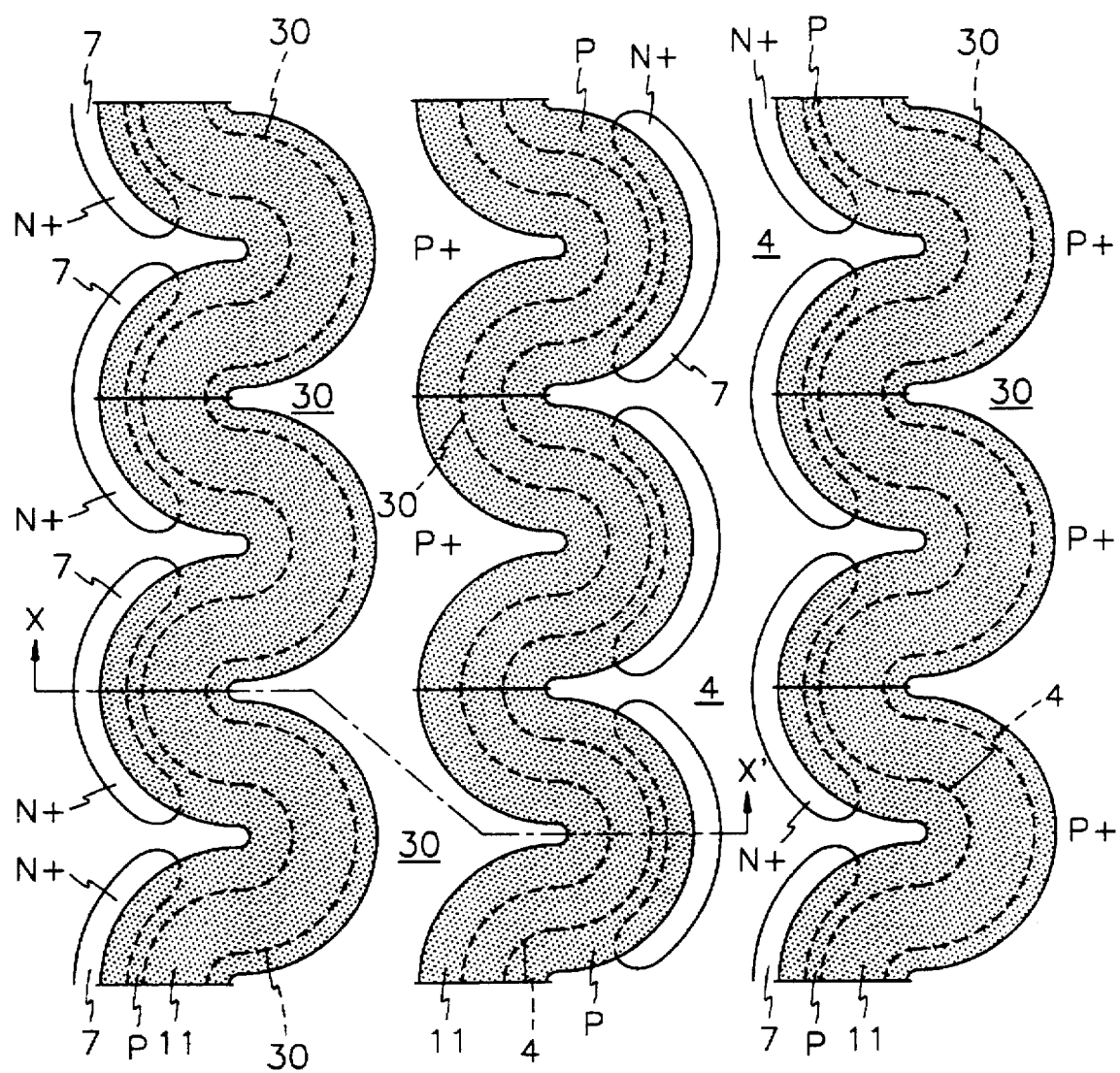
FIG. 7G is a plan view of a multi-celled power semiconductor device according to a fourth embodiment of the present invention.

Referring now to FIGS. 7A–7G, a preferred multicelled power semiconductor device according to the present invention will now be described. In particular, FIG. 7A illustrates a circular ring-shaped gate electrode 11 having first and second sections 110 and 120 which can be reconfigured as illustrated by FIGS. 7B–7D to form a relatively large gate electrode segment. Moreover, as illustrated by FIG. 7E, a multicelled power semiconductor device (e.g., IGBT) can be formed using a plurality of serpentine-shaped gate electrodes 11 spaced side-by-side. Referring now to FIG. 5B and FIGS. 7F–7G, two preferred embodiments of the present invention having a plurality of arcuate-shaped source regions 7 are illustrated. To further illustrate, the cross-sectional structure of the device of FIG. 7G is generally illustrated by FIG. 5B. For example, the cross-sectional view of FIG. 5B generally illustrates the cross-section of the device of FIG. 7G taken along line X–X'. Accordingly, the present invention preferably comprises a semiconductor substrate containing an anode/emitter region 1 of second conductivity type (e.g., P-type) and a drift region 3 and buffer region 2 of first conductivity type (e.g., N-type) therein.

As illustrated best by FIG. 5B, the drift region 3 preferably extends to a first (e.g., upper) face of the substrate and as best illustrated by FIGS. 7F and 7G, a plurality of arcuate-shaped source regions 7 of first conductivity type (e.g., N-type) are provided in each base region 4. As illustrated, the perimeters of each source region 7 contain concave-shaped segments (when view from outside the source region) and convex-shaped segments. These concave-shaped segments are spaced from the perimeter of the base region 4 so that respective arcuate-shaped channel regions are formed therebetween at the first face. Each multicelled device preferably also comprises a plurality of spaced serpentine-shaped gate electrodes 11 so that the application of a first potential bias (e.g., positive) will create a plurality of arcuate-shaped inversion-layer channels in the channel regions.

These inversion-layer channels provide electrical "shorts" between respective source regions 7 and the drift region 3 to thereby initiate turn on of vertical bipolar transistors when the emitter/anode region 1 is forward biased relative to the cathode contact 13. As further illustrated by FIGS. 7F and 7G, the source regions are preferably arranged as a row of source regions which are spaced end-to-end in each base region 4. As illustrated best by FIG. 7F, each base region 4 may contain only a single row of source regions adjacent one edge thereof with the other edge free to act as a bypass region with respect to an adjacent device. However, in FIG. 7G, the bypass regions 30 are spaced between each pair of adjacent base regions 4 and each base region contains two rows of source regions 7 which are patterned adjacent respective first and second edges thereof.

As determined by the inventors herein, the use of arcuate-shaped source regions 7 limits the likelihood of parasitic thyristor latch-up by "spreading" the hole current entering each base region 4 during forward conduction. As will be understood by those skilled in the art, by spreading the hole current into diverging paths, the magnitude of the hole current density underneath each source region 7 is reduced and therefore the likelihood that the P-N junctions formed between the base region 4 and source regions 7 will become forward biased and initiate parasitic thyristor latch-up is reduced. In addition, the bypass regions 30 also act as collectors of hole current to thereby reduce the total hole current in the base regions 4 during forward conduction. The application of a second potential bias (e.g., negative) to the gate electrodes 11 can also limit parasitic thyristor latch-up by connecting each bypass region 30 to an adjacent base region 4 via a P-type inversion-layer channel (formed in the drift region 3 at the first face). In particular, the base and bypass regions can be connected in the substrate to lower the effective lateral resistance of the base regions (which lessens the likelihood that the base/source region junctions will become forward biased) and allow excess holes in the base region to be swept away to the bypass region via the P-type inversion layer channel.

Figure 8A:
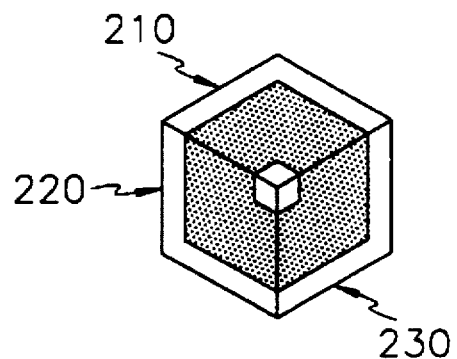
FIGS. 8A-8F are plan views of gate patterns according to the second embodiment of the present invention.
Figure 8B:
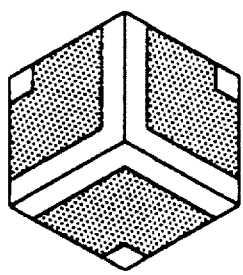
Figure 8C:
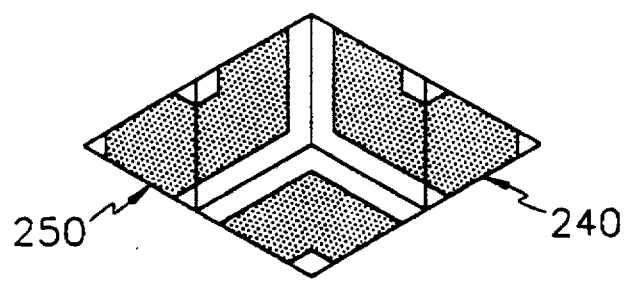
Figure 8D:
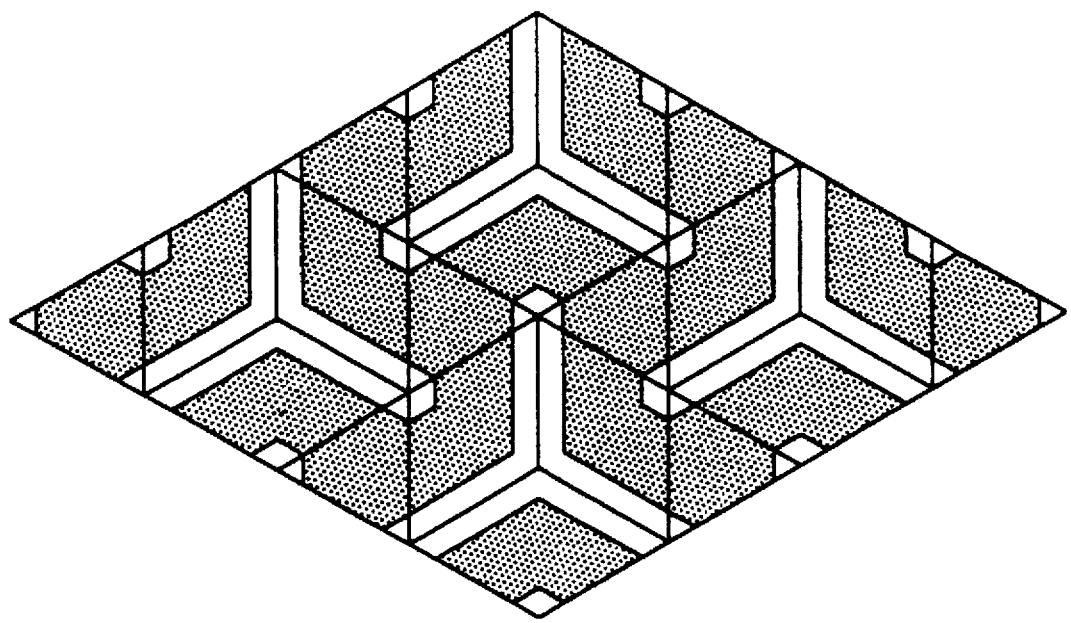
Figure 8E:
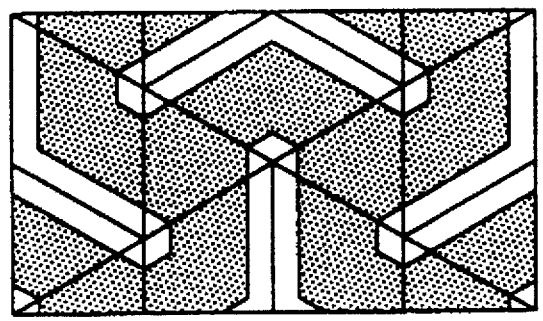
Figure 8F:
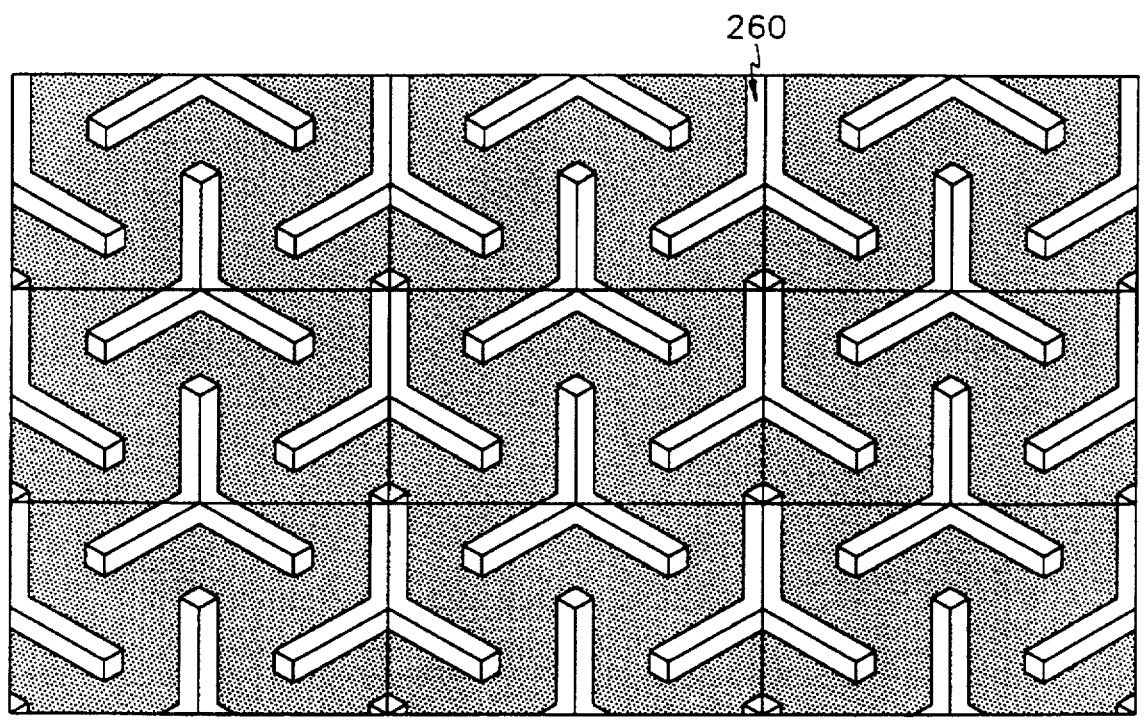

Other preferred embodiments of the present invention will now be described. In particular, the structure of a power transistor in accordance with another embodiment of the present invention is illustrated by FIGS. 8A to 8F. In FIG. 8A, a unit cell having a hexagonal-shaped gate electrode is illustrated. As will be understood by those skilled in the art, the central area exposes the P+ contact region and the annular ring-shaped area at the perimeter exposes the P+ bypass region. The gate electrode is comprised of three pieces 210, 220 and 230 which as illustrated by FIGS. 8B–8F can be reconfigured as a multicelled device. The three pieces 210, 220 and 230 can be rearranged so that the borders on the channel are facing inward and the borders on the clamping/bypass region are facing outward. This is the structure in which the inside is turned out. However, two pieces 240 and 250 of a regular triangle are inserted, being opposite from each other since the structure in FIG. 8B is not repetitive. Here, the gate electrodes are not formed at the three apexes of the regular triangle pieces, and the P+ region is formed under the three apexes of the regular triangle pieces. Now, the repetitive primitive lattice of a diamond is made as illustrated in FIG. 8C. These four primitive lattices form the structure in FIG. 8D, and the repetitive rectangular cell unit is made by cutting the structure properly as illustrated in FIG. 8E. Lastly, the structure in FIG. 8F is formed when the cell units are arranged in every direction. As a result, a plurality of non-electrode portions 260, in which the gate electrodes are not formed, are arranged regularly in the plane structure of the power transistor in accordance with this embodiment of the present invention. The shape of the border of each non-electrode portion 260 is a Y type with three concave portions and three convex portions. The convex portion of one non-electrode portion 260 faces the convex portion of the adjacent non-electrode portion 260. This structure is called an inverted hexagonal cell since the elementary structure is an inverted hexagon.

Two pieces of a regular triangle are included in the ALL structure in the case of the inverted hexagonal cell, and the area of the two pieces occupies 25% of the total area. Accordingly, the width and the length of the channel in the inverted hexagonal cell are greater than those in the conventional ALL structure in which the width and the length of the channel are wasted due to the areas of the bridges, for connecting the gate electrodes, occupying 25% of the total area.

On the other hand, the ALL structure formed with a hexagonal shape is 16% denser than an ALL structure formed at a right angle. As a result, the ideal ALL structure, that is, the structure in which the widths of the bridges is narrow obtains channel efficiency of 87%, compared with the structure formed at the right angle. In addition, it is not difficult to design gate lines since all the gate electrodes are connected in the inverted hexagonal cell unlike the serpentine-shaped electrodes discussed above.

Figure 9A:
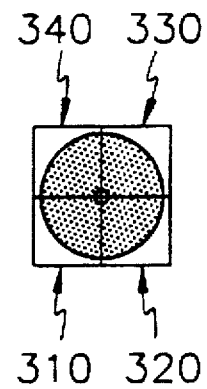
FIGS. 9A-9G are plan views of gate patterns according to a fifth embodiment of the present invention.
Figure 9B:
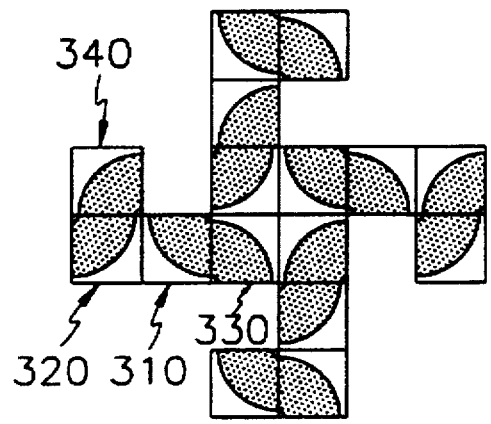
Figure 9C:
Figure 9D:
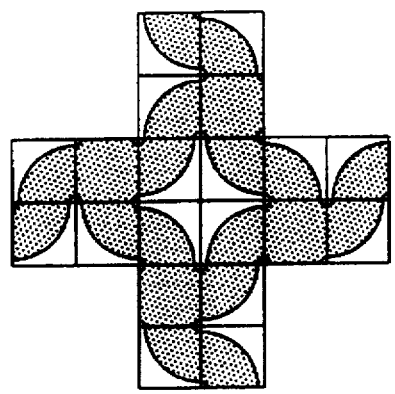

Lastly, the plane structure of the power transistor in accordance with another preferred embodiment of the present invention is described in detail with reference to FIGS. 9A to 9F. The elementary structure in accordance with this embodiment of the present invention is circular as illustrated in FIG. 9A. This structure is equally divided into four pieces 310, 320, 330 and 340. As illustrated in FIG. 9B, the positions of a left lower piece 310 and a right lower piece 320 are switched, and a right upper piece 330 is attached to the right side of the left lower piece 310 among four pieces 310, 320, 330 and 340. Four of these structures are collected, with the right upper pieces 330 facing one another, thereby making a structure similar to a pinwheel shape. On the other hand, four pieces of the regular square 300 in FIG. 9C are added respectively since the structure in FIG. 9B is not repetitive, whereby making a primitive lattice similar to a cross shape. Here, the gate electrodes are not formed at four apexes of the regular square pieces, and the P⁺ region is formed under the three apexes of the regular triangle pieces as illustrated in FIG. 9D.

Figure 9E:
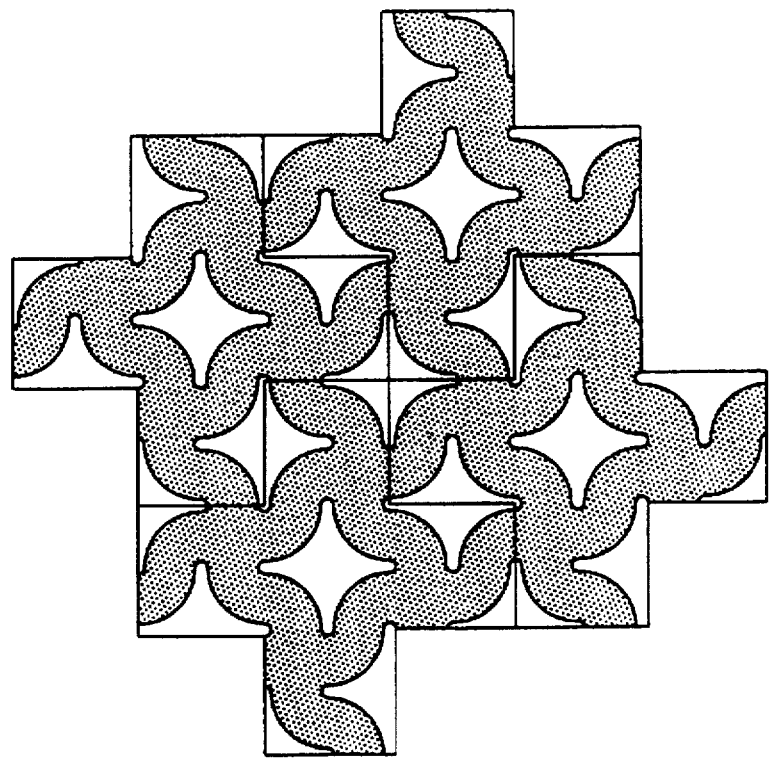
Figure 9F:
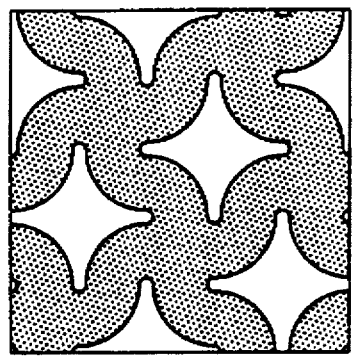
Figure 9G:
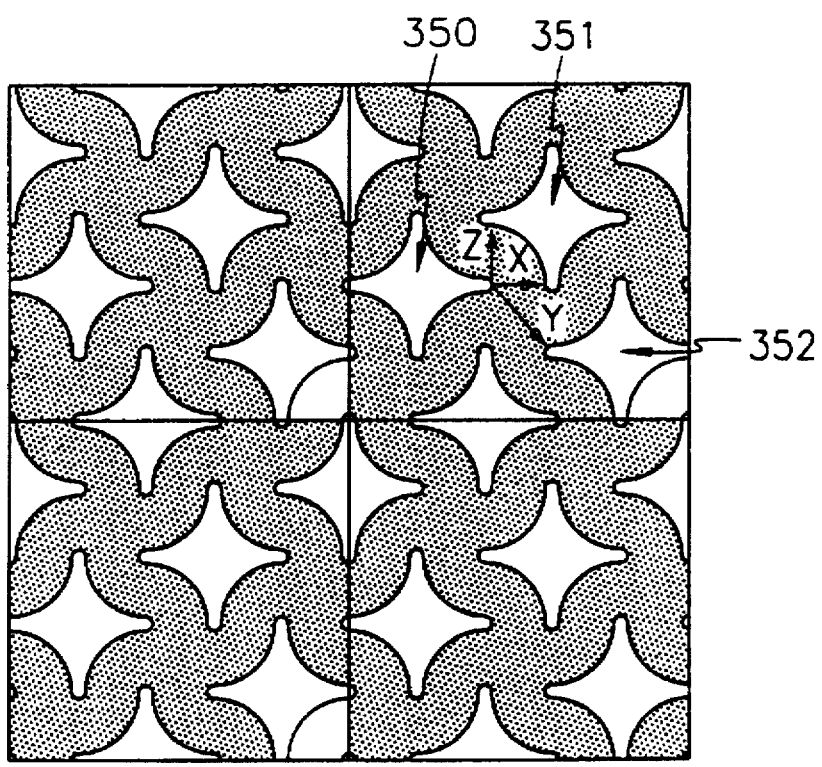

These four primitive lattices form the structure in FIG. 9E, and the repetitive rectangular cell unit is made by cutting the structure properly as illustrated in FIG. 9F. Lastly, the structure in FIG. 9G is formed when the cell units are arranged in every direction. As a result, a plurality of non-electrode portions 350, 351 and 352 in which the gate electrodes are not formed, are arranged regularly in the plane structure of the power transistor in accordance with this preferred embodiment of the present invention. The shape of the border of each non-electrode portions 350, 351 and 352 include four concave portions and four convex portions, and is formed symmetrically. Supposing that a direction toward a convex portion from the center of the non-electrode portion 350 is a front direction X, the convex portion of the border in the non-electrode portion 350 faces a convex portion, a concave portion and a convex portion of the nearest non-electrode portion 351 one by one ongoing from the front direction X to the left direction Z, and the convex portion of the border in the non-electrode portion 350 faces a convex portion of the second nearest non-electrode portion 352 from the front direction X to the right direction Y at 45 degrees.

This structure is called a close-packed cross cell since the structure consists of the primitive lattice of a cross shape. The area of the part originated from the ALL structure occupies 80% of the close-packed cross cell in the total area. Accordingly, the size of the width and the length of the channel per area are large, compared with the ALL structure in which the ratio of the width and the length of the channel, which are wasted due to the area occupied by the bridges between the gate electrodes is over 20%. In addition, it is easy to design the gate lines since all the gate electrodes are connected, compared with the serpentine gate electrode design.

Figure 10:
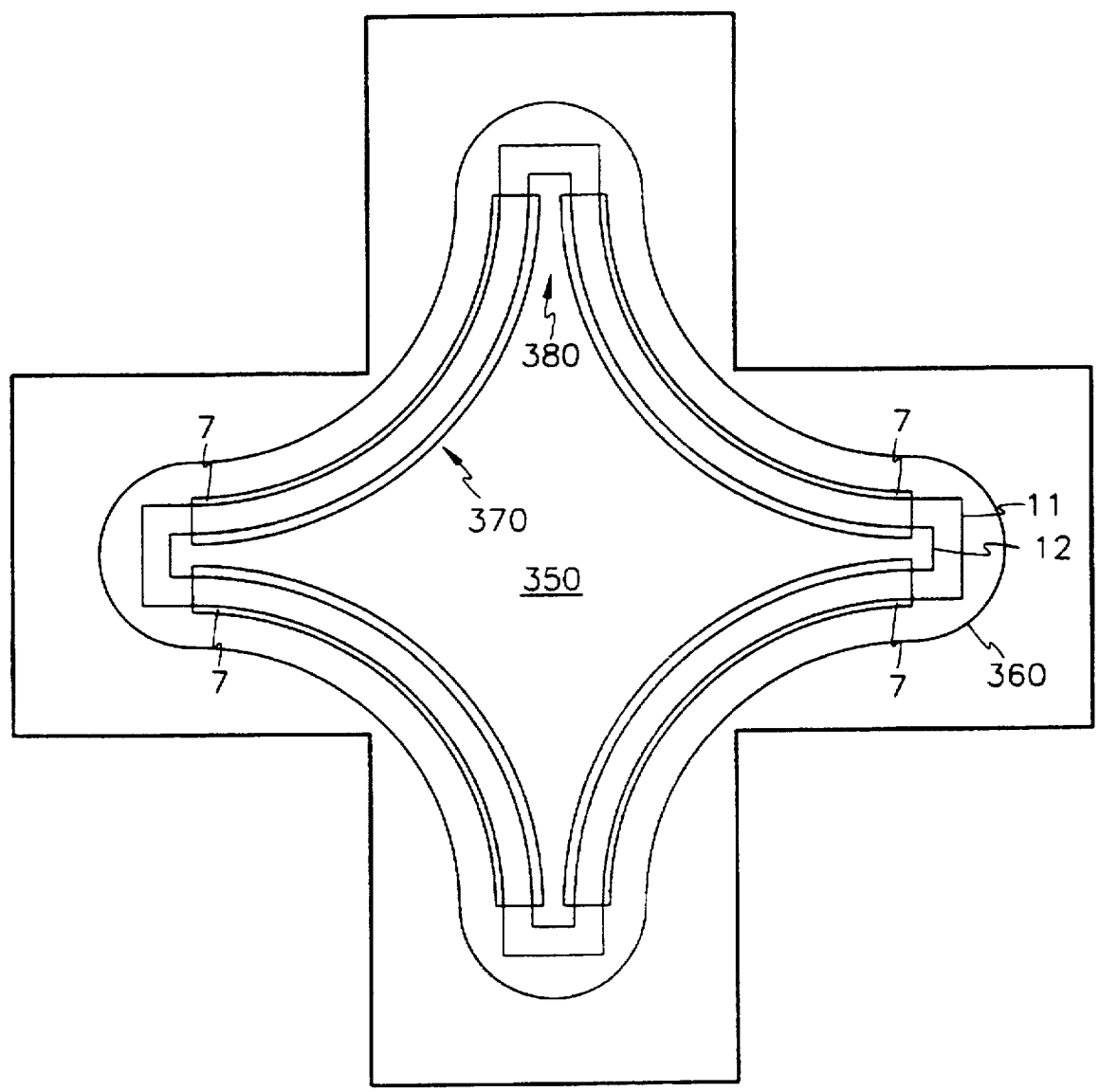
FIG. 10 is a plan view of a power transistor in accordance with the fifth embodiment of the present invention.

Hereinafter, the layout of the power transistor with the structure in FIG. 9 is explained in detail with reference to FIG. 10. The P⁺ region 360 is formed outward the non-electrode portion 350 in which the pattern of the gate electrodes 11 is not formed. A part near the concave portion 380 originates from the clamping region (reference numeral 30 in FIG. 5B) of the elementary structure and the added piece (reference numeral 340 in FIG. 9C), and a part near the convex portion 370 originates from the P type well (reference numeral 4 in FIG. 5B) of the elementary structure in the P⁺ regions 360. The gate insulating layer 12 is formed along the border of the non-electrode portion 350 inward the non-electrode portion 350, and the N⁺ region 7 is formed inward the convex portion 370 of the non-electrode portion 350. As described the above, the efficiency of the device is enhanced because the width and the length of the channel become large when the ALL structure is changed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A power semiconductor device, comprising:
   a semiconductor substrate containing a drift region of first conductivity type therein extending to a first face thereof;
   a base region of second conductivity type in said drift region, said base region having a perimeter at the first face which defines a P-N junction with said drift region;
   a plurality of arcuate-shaped source regions of first conductivity type in said base region, said source regions defined by respective perimeters containing concave-shaped segments which are spaced from the perimeter of said base region; and
   means, comprising a serpentine-shaped insulated gate electrode, for forming inversion-layer channels of first conductivity type in said base region to electrically connect said source regions to said drift region, upon application of a first potential bias thereto.

2. The device of claim 1, wherein said plurality of arcuate-shaped source regions are arranged as a row of arcuate-shaped source regions spaced end-to-end in said base region.

3. A power semiconductor device, comprising:
   a semiconductor substrate containing a drift region of first conductivity type therein extending to a first face thereof;
   a base region of second conductivity type in said drift region, said base region having a perimeter at the first face which defines a P-N junction with said drift region;
   a plurality of arcuate-shaped source regions of first conductivity type in said base region, said source regions defined by respective perimeters containing concave-shaped segments which are spaced from the perimeter of said base region; and means, comprising a serpentine-shaped insulated gate electrode, for forming inversion-layer channels of first conductivity type in said base region to electrically connect said source regions to said drift region, upon application of a first potential bias thereto;

wherein said plurality of arcuate-shaped source regions are arranged as a row of arcuate-shaped source regions spaced end-to-end in said base region.

wherein a first edge of the serpentine-shaped gate electrode contains a plurality of convex-shaped segments; and wherein each of said plurality of arcuate-shaped source regions is arranged opposite a respective convex-shaped segment.

4. The device of claim 3, wherein the perimeter of said base region contains a plurality of concave-shaped segments arranged opposite respective concave-shaped segments at the perimeters of said source regions.

5. The device of claim 4, wherein portions of said base region at the first face which extend between concave-shaped segments at the perimeters of said source regions and respective concave-shaped segments at the perimeter of said base region, are arcuate-shaped.

6. The device of claim 4, wherein application of the first potential bias to said channels forming means causes the formation of inversion-layer channels in the arcuate-shaped portions of said base region.

7. The device of claim 6, further comprising a bypass region of second conductivity type in said drift region at the first face; and wherein said channels forming means comprises means for forming inversion-layer channels of second conductivity type in said drift region to electrically connect said base region to said bypass region upon application of a second potential bias thereto.

8. The device of claim 7, wherein said bypass region has a perimeter at the first face which defines a P-N junction with said drift region; and wherein the perimeter of said bypass region contains a plurality of concave-shaped segments and convex-shaped segments.

9. The device of claim 8, wherein the convex-shaped segments at the perimeter of said bypass region are arranged opposite respective concave-shaped segments at the perimeters of said source regions.

10. A power semiconductor device, comprising:

a semiconductor substrate containing a drift region of first conductivity type therein extending to a first face thereof;

a base region of second conductivity type in said drift region, said base region having a perimeter at the first face which defines a P-N junction with said drift region;

a plurality of arcuate-shaped source regions of first conductivity type in said base region, said source regions defined by respective perimeters containing concave-shaped segments which are spaced from the perimeter of said base region;

means, comprising a serpentine-shaped insulated gate electrode, for forming inversion-layer channels of first conductivity type in said base region to electrically connect said source regions to said drift region, upon application of a first potential bias thereto;

a bypass region of second conductivity type in said drift region at the first face;

wherein said channels forming means comprises means for forming inversion-layer channels of second conductivity type in said drift region to electrically connect said base region to said bypass region upon application of a second potential bias thereto; and wherein said plurality of arcuate-shaped source regions are arranged as a row of arcuate-shaped source regions spaced end-to-end in said base region.

11. The device of claim 10, wherein said bypass region has a perimeter at the first face which defines a P-N junction with said drift region; and wherein the perimeter of said bypass region contains a plurality of concave-shaped segments and convex-shaped segments.

12. The device of claim 11, wherein the convex-shaped segments at the perimeter of said bypass region are arranged opposite respective concave-shaped segments at the perimeters of said source regions.

13. An insulated-gate bipolar transistor, comprising:

a semiconductor substrate containing a drift region of first conductivity type therein extending to a first face thereof and an emitter region of second conductivity type therein extending to a second face thereof;

a base region of second conductivity type in said drift region, said base region having a perimeter at the first face which defines a P-N junction with said drift region;

a plurality of arcuate-shaped source regions of first conductivity type in said base region, said source regions defined by respective perimeters containing concave-shaped segments which are spaced from the perimeter of said base region; and means, comprising a serpentine-shaped insulated gate electrode, for forming inversion-layer channels of first conductivity type in said base region to electrically connect said source regions to said drift region, upon application of a first potential bias thereto.

14. The transistor of claim 13, further comprising a buffer region of first conductivity type in said substrate, between said emitter region and said drift region; and wherein a concentration of first conductivity type dopants in said buffer region is greater than a concentration of first conductivity type dopants in said drift region.

15. The transistor of claim 14, wherein said plurality of arcuate-shaped source regions are arranged as a row of arcuate-shaped source regions spaced end-to-end in said base region.

16. The device of claim 15, wherein a first edge of the serpentine-shaped gate electrode contains a plurality of convex-shaped segments; and wherein each of said plurality of arcuate-shaped source regions is arranged opposite a respective convex-shaped segment.

17. The device of claim 16, wherein the perimeter of said base region contains a plurality of concave-shaped segments arranged opposite respective concave-shaped segments at the perimeters of said source regions.

18. The device of claim 17, wherein portions of said base region at the first face which extend between concave-shaped segments at the perimeters of said source regions and respective concave-shaped segments at the perimeter of said base region, are arcuate-shaped.

19. The device of claim 17, wherein application of the first potential bias to said channels forming means causes the formation of inversion-layer channels in the arcuate-shaped portions of said base region.

20. The device of claim 19, further comprising a bypass region of second conductivity type in said drift region at the first face; and wherein said channels forming means comprises means for forming inversion-layer channels of second conductivity type in said drift region to electrically connect said base region to said bypass region upon application of a second potential bias thereto.

21. The device of claim 20, wherein said bypass region has a perimeter at the first face which defines a P-N junction with said drift region; and wherein the perimeter of said bypass region contains a plurality of concave-shaped segments and convex-shaped segments.

22. The device of claim 21, wherein the convex-shaped segments at the perimeter of said bypass region are arranged opposite respective concave-shaped segments at the perimeters of said source regions.

* * * * *